(12) United States Patent
Sadowsky

(10) Patent No.: US 7,234,100 B1
(45) Date of Patent: Jun. 19, 2007

(54) DECODER FOR TRELLIS-BASED CHANNEL ENCODING

(75) Inventor: John S. Sadowsky, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 760 days.

(21) Appl. No.: 09/670,231

(22) Filed: Sep. 28, 2000

(51) Int. Cl.
*H03M 13/03* (2006.01)

(52) U.S. Cl. .................. 714/792; 714/796

(58) Field of Classification Search .......... 714/786, 714/792, 795, 730, 796; 712/236; 708/406; 375/295

See application file for complete search history.

(56) References Cited

U.S. PATENT DOCUMENTS

| | | | | |
|---|---|---|---|---|
| 5,045,993 A | * | 9/1991 | Murakami et al. | 712/236 |
| 5,291,499 A | | 3/1994 | Behrens et al. | |
| 5,408,502 A | * | 4/1995 | How | 375/340 |
| 5,612,974 A | * | 3/1997 | Astrachan | 375/295 |
| 5,633,897 A | * | 5/1997 | Fettweis et al. | 375/341 |
| 5,742,621 A | * | 4/1998 | Amon et al. | 714/792 |
| 5,784,293 A | * | 7/1998 | Lipa | 708/410 |
| 5,796,757 A | * | 8/1998 | Czaja | 714/789 |
| 5,912,908 A | * | 6/1999 | Cesari et al. | 714/795 |
| 5,987,490 A | * | 11/1999 | Alidina et al. | 708/523 |
| 6,009,128 A | * | 12/1999 | Mobin et al. | 375/341 |
| 6,029,267 A | * | 2/2000 | Simanapalli et al. | 714/795 |
| 6,115,436 A | * | 9/2000 | Ramesh et al. | 375/341 |
| 6,257,756 B1 | * | 7/2001 | Zarubinsky et al. | 714/795 |
| 6,330,684 B1 | * | 12/2001 | Yamanaka et al. | 714/1 |
| 6,374,387 B1 | * | 4/2002 | van den Berghe | 714/790 |

FOREIGN PATENT DOCUMENTS

| | | |
|---|---|---|
| JP | 8-340262 | 12/1996 |
| JP | 9-46240 | 2/1997 |
| JP | 11-330987 | 11/1999 |

OTHER PUBLICATIONS

Hocevar D.E. et al., *Achieving Flexibility In A Viterbi Decoder DSP Coprocessor*, VTC 2000-Fall. IEEE VTS 52nd Vehicular Technology Conference, Boston, MA, Sep. 24-28, 2000, pp. 2257-2264.

(Continued)

*Primary Examiner*—Guy Lamarre
*Assistant Examiner*—Mujtaba K. Chaudry
(74) *Attorney, Agent, or Firm*—Trop, Pruner & Hu, P.C.

(57) ABSTRACT

A system and method for decoding a channel bit stream efficiently performs trellis-based operations. The system includes a butterfly coprocessor and a digital signal processor. For trellis-based encoders, the system decodes a channel bit stream by performing operations in parallel in the butterfly coprocessor, at the direction of the digital signal processor. The operations are used in implementing the MAP algorithm, the Viterbi algorithm, and other soft- or hard-output decoding algorithms. The DSP may perform memory management and algorithmic scheduling on behalf of the butterfly coprocessor. The butterfly coprocessor may perform parallel butterfly operations for increased throughput. The system maintains flexibility, for use in a number of possible decoding environments.

16 Claims, 16 Drawing Sheets

OTHER PUBLICATIONS

Robertson P. et al., *A Comparison Of Optimal And Sub-Optimal Map Decoding Algorithms Operating In The Log Domain,* Communications—Gateway to Globalization. Proceedings of the Conference on Communications, Seattle, Jun. 18-22, 1995, pp. 1009-1013.

Benedetto S. et al., *Soft-Output Decoding Algorithms In Interactive Decoding Of Turbo Codes,* TDA Progress Report, No. 42-124, Feb. 15, 1996, pp. 63-87.

Taipala, D., *Implementing Viterbi Decoders Using the VLS Instruction On DSP Families DSP 56300 and DSP56600,* www.motorola.com, 1998, pp. 1-108.

Author Unknown, *AT40K FPGA IP Core; AT40K-FFT,* www.amtel.com, Aug. 1998, pp. 1-8.

Walther et al., *DSP Implementation Issues For UMTS-Channel Coding,* IEEE VTS-Fall VTC 2000, 52nd, Sep. 24, 2000, pp. 3219-3222.

Hocevar et al., *Achieving Flexibility In A Viterbi Decoder DSP Coprocessor,* IEEE 2000 ICASSP, Jun. 4, 2000, pp. 2257-2264.

Yee et al., *Burst-by-Burst Adaptive Turbo-Coded Radial Basis Function-Assisted Decision Feedback Equalization,* IEEE Transactions on Communications, vol. 49, No. 11, Nov. 2001, pp. 1935-1945.

\* cited by examiner

| state k (shift regs) | $U_k$ input | code word $U_{k+1} P_{k+1}$ | state k+1 (shift regs) |
|---|---|---|---|
| 00 | 0 | 00 | 00 |
| 00 | 1 | 10 | 10 |
| 01 | 0 | 00 | 10 |
| 01 | 1 | 10 | 00 |
| 10 | 0 | 01 | 11 |
| 10 | 1 | 11 | 01 |
| 11 | 0 | 01 | 01 |
| 11 | 1 | 11 | 11 | state transition table 60

FIGURE 3

TURBO ENCODER

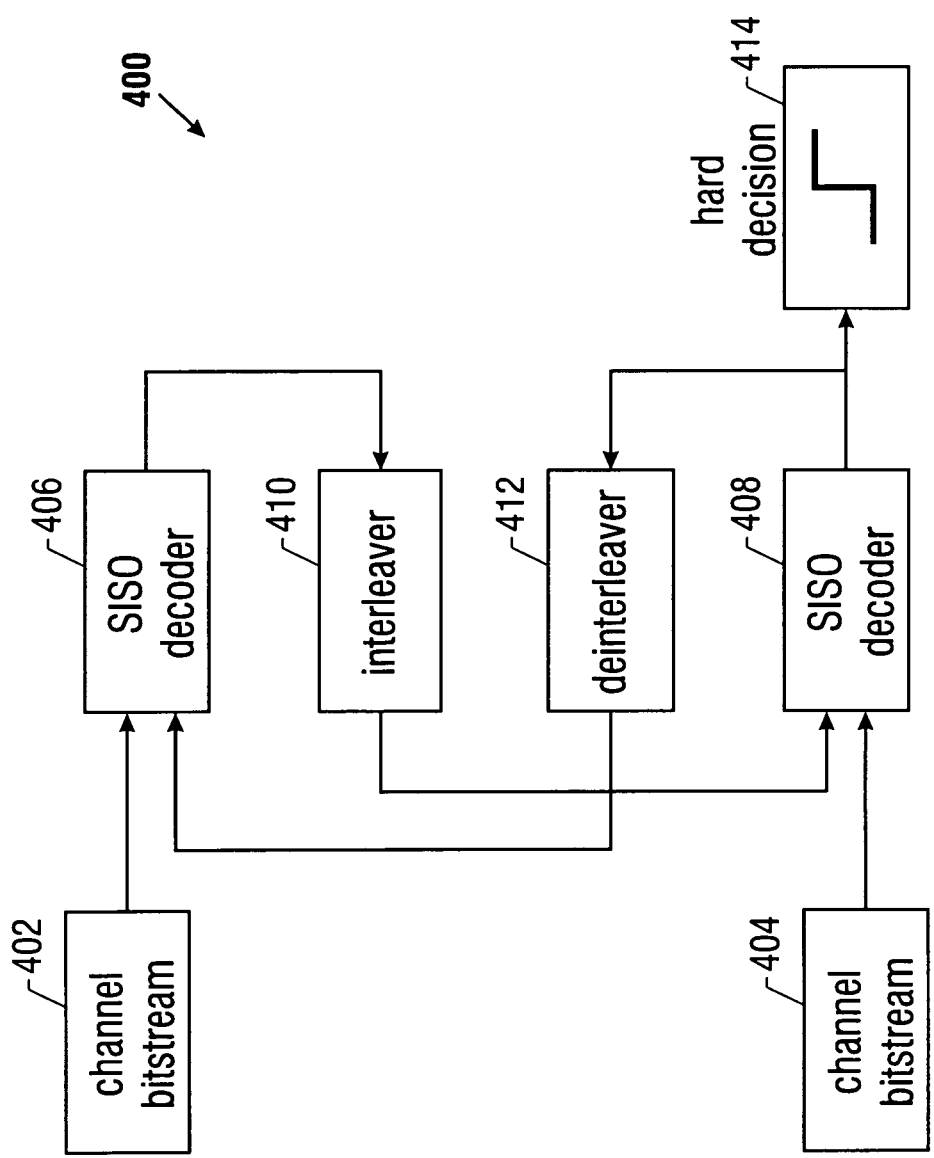

DECODER FOR TRELLIS-BASED CHANNEL ENCODING

BACKGROUND

This invention relates to decoding operations performed upon channel coded data and, more particularly, to decoders which operate upon trellis diagrams.

Communication between systems is possible whenever a common channel connects the systems. Whether by network cables, telephone lines, or Internet Protocol sockets, the data communicated between entities travels through a channel medium.

Unfortunately, "noise" and "interference" in the channel medium may corrupt the data during transmission. Factors such as the length of the channel medium, the amount of data transmitted, the presence of spurious signals in the channel, and other environmental conditions may affect the amount of noise and interference and, thus, the quality of the received data.

The phenomena of noise and interference in a channel are so expected that the data is almost always encoded before being transmitted. A data encoder is generally made up of discrete logic such as flip-flops and NAND gates. The data encoder receives a stream of data bits, known as information bits, that are to be transmitted through a channel medium and generates additional bits, known as parity bits, based upon the information bits themselves. Together, the information bits and the parity bits make up an encoded bit stream.

This carefully designed redundant information is known as forward error correction (FEC) or channel coding. Once constructed, the encoded bit stream is transmitted across the channel. In some cases, the encoded bit stream may be modulated prior to transmission.

Upon transmission over the channel and subsequent demodulation at the receiver, some of the '1' bits (or a modulated representation thereof) may be corrupted such that they are received as '0' bits. Likewise, some of the '0' bits may be received as '1' bits. In modern digital wireless receivers, the demodulator may also report bit-by-bit "reliability metrics." Clearly received 1's and 0's produce a high reliability metric, while ambiguously received data produces a low reliability metric. The information bits or the parity bits of the encoded bit stream, or both, may be corrupted during transmission.

In addition to the demodulator, the receiving entity includes a decoder whose purpose is to determine the information bits most likely to have been transmitted, using the demodulator outputs and knowledge of the structure of the encoder. The bit reliability metric described above can significantly enhance the capability of the decoder. As expected, the decoder may be considerably more complex than the encoder.

Shannon's celebrated Channel Coding Theorem is the inspiration for the drive towards more and more complex coded digital communications systems. Shannon's theorem states that as long the information rate (transmitted information bits per second) does not exceed the Channel Capacity, then it is possible to design FEC coding systems with arbitrarily small decoding error probability.

Shannon's theorem, however, is an asymptotic result. It actually tells us little about how to design practical coding systems—only that perfect decoding is approachable as the coding block size (number of information bits) and code complexity tends to infinity. It turns out that very powerful, hence complex, codes are easy to construct.

The difficult task, then, is to find an efficient decoding algorithm for these complex codes. Thus, the practical task of FEC code design is to find families of powerful (hence, complex) codes having specific structure that can be exploited to obtain a decoder of practical implementation complexity. Of course, as digital technology marches forward, more and more complex decoders become possible.

Some decoding algorithms operate upon specialized state diagrams, known as trellis diagrams, to produce a decoded output. A trellis diagram is a state machine that demonstrates possible state transitions of an encoder over time. Trellis diagrams describe all the possible states of the encoder, at each point in time. Many decoding algorithms use trellis diagrams, along with the channel bit stream, to arrive at the correct information bits.

The volume of calculations involved with trellis-type decoding, however, can be staggering. Accordingly, decoders may be implemented with application-specific integrated circuits (ASICs) which perform specialized trellis operations, such as butterfly operations, very efficiently. Because of the complexity of the various decoder algorithms, such ASICs may typically be designed for a single algorithm.

Other decoders may include general-purpose digital signal processors (DSPs), which may or may not include special instructions for performing trellis operations. These decoders may be programmable such that different decoding algorithms may be implemented, as needed. Such decoders may be more flexible, but may decode channel data at a slower rate than the ASIC-based decoders.

Thus, there is a continuing need for a programmable processor that may be used with a general-purpose digital signal processor for performing trellis-based decoding operations.

BRIEF DESCRIPTION OF THE DRAWINGS

FIG. 3 is a state transition table for the encoder of FIG. 2, according to one embodiment of the invention;

FIG. 16 is a block diagram of a turbo decoder, according to one embodiment of the invention.

DETAILED DESCRIPTION

In accordance with several embodiments described herein, a system and method are disclosed for efficiently performing specialized operations used in decoding certain types of channel bit streams. The specialized operations are known as butterfly operations. Although the Viterbi and MAP decoding algorithms are described in detail, the system and method may be implemented using other decoding algorithms that operate on trellis diagrams.

The operations described herein pertain to the implementation of certain trellis-based algorithms. The algorithm class is used in practice in a number of applications in communications and signal processing, including (but not limited to) coding and decoding convolutional and turbo codes, channel equalization, and speech coding. An FEC decoding application is described herein for illustrative purposes only and is no way meant to limit the scope of the invention.

Figure 1:
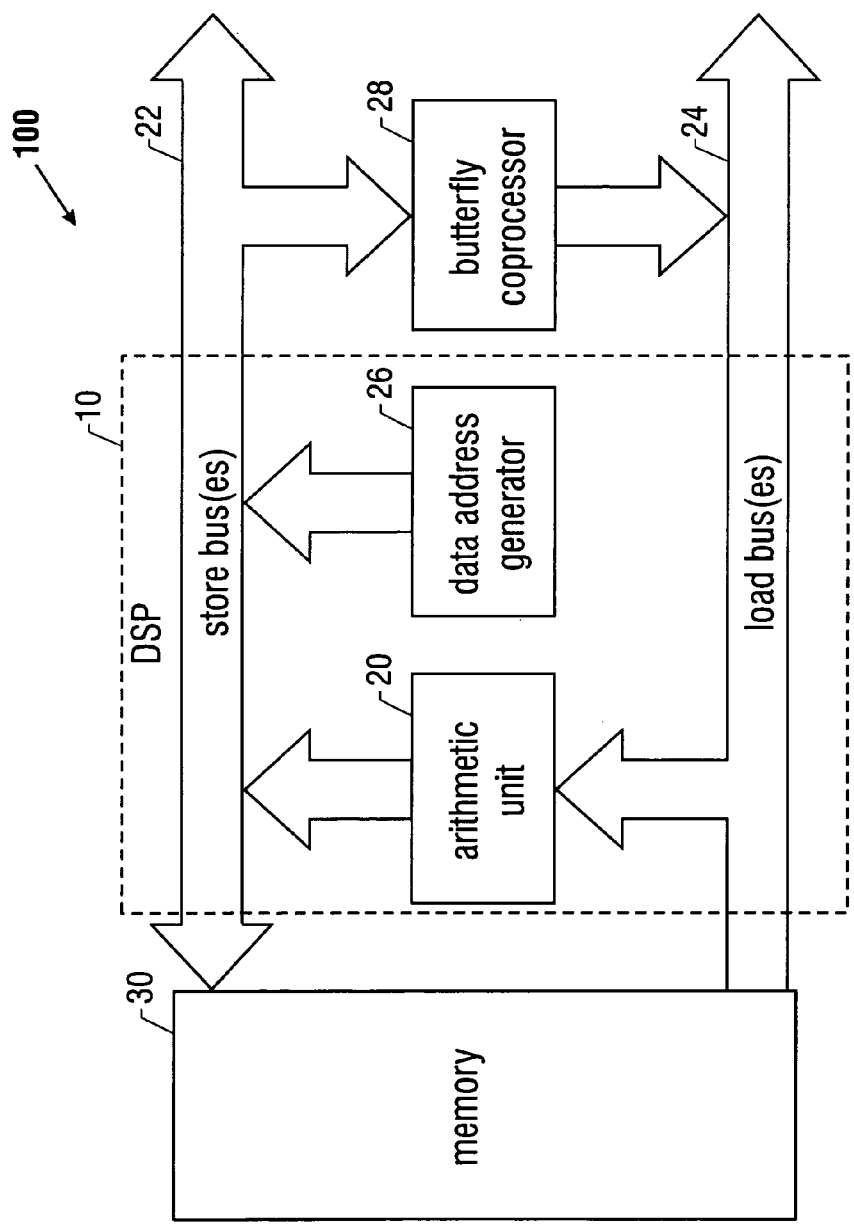
FIG. 1 is a block diagram of a system, according to one embodiment of the invention.

In FIG. 1, according to one embodiment, a system 100 includes a digital signal processor 10 and a butterfly coprocessor 28. Digital signal processors, or DSPs, are specialized microprocessors with architectures that are tuned for digital signal processing. DSPs typically feature circuitry that may perform high-speed arithmetic operations, data transfers to and from external devices, and multiple accesses to memories. For example, DSPs may include parallel extended 16- or 32-bit buses, specific data address generators for accessing memory, and multiply accumulate (MAC) arithmetic units.

In FIG. 1, the DSP 10 includes two buses, a memory store bus 22 and a memory load bus 24. The memory store bus 22 and the memory load bus 24 extend beyond the digital signal processor 10, for connecting to a memory 30. In a second embodiment, the memory store and memory load buses 22 and 24 are combined as one bus.

An arithmetic unit 20 is coupled to the memory store bus 22 and the memory load bus 24. The arithmetic unit 20 may include one or more multiply accumulate units, registers, and other circuitry for performing arithmetic operations. Also coupled to the memory store bus 22 and the memory load bus 24 is a data address generator 26. The data address generator 26 identifies the particular location in the memory 30 to be either loaded or stored. The data address generator 26 performs this operation on behalf of other circuitry of the DSP 10, such as the arithmetic unit 20.

In one embodiment, the system 100 further includes a butterfly coprocessor 28. The butterfly coprocessor 28 is not part of the DSP 10, but is coupled to the DSP 10 by the memory store and memory load busses 22 and 24. Like the arithmetic unit 20, the butterfly coprocessor 28 has access to the memory 30 using these busses. As further described herein, the system 100 may be used in decoders to perform trellis diagram decoding of encoded channel bit streams.

The particular DSP 10 is illustrative only. The configuration of the circuitry of FIG. 1 is provided to illustrate one of several possible implementations of the system 100. DSPs typically further include components such as registers, control blocks, circuitry for performing direct memory access (DMA), and other circuitry, which is not described in FIG. 1. DSPs may be implemented with single or multiple memory buses and may feature additional buses, such as for peripheral device access.

In one embodiment, the DSP 10 performs memory management on behalf of the butterfly coprocessor 28, for performing high-speed and parallel butterfly operations. Before describing the system 100 in detail, however, an introduction to encoding and decoding techniques will provide a basis for understanding the invention.

When transmitting an information data stream over a channel medium, there are several possible ways to correct errors. For example, if the error rate is too high, the transmitter power may be increased, to reduce the error rate. For some applications, such as cell phones, this solution is unworkable because the available battery power is size-limited.

Another solution may be to duplicate the transmission, either by sending the same information data stream twice over the same channel medium or by sending the data stream over two different channels. The duplicate data streams may then be compared to one another at the receiver. Redundancy, however, tends to add cost to a system and may increase the time to process the information data stream as well.

A third possibility may be for the receiver to employ an automatic repeat request (ARQ) mechanism. The receiver, upon determining that the errors occurred during transmission, may request retransmission of the data stream. This, however, is not an encoding scheme, and thus may not be a good solution for noisy channels.

Forward error correction is a technique where extra bits are added to a data stream of information prior to transmission over a channel. Once transmitted, a receiver may include a decoder that corrects any errors that may have occurred during the transmission.

Convolutional codes, also called binary convolutional codes, or BCC, are produced from a continuous stream of incoming data. By contrast, block codes result when the encoder splits the incoming data stream into fixed length blocks prior to encoding them. Both convolutional and block codes are types of forward error correction codes.

Likewise, many decoders are well known for decoding both block and convolutional codes. The Viterbi decoding algorithm, for example, is popular for decoding convolutional codes. The Viterbi algorithm is a "hard" output algorithm, meaning that the actual information bit results from successful execution of the algorithm. Alternatively, the maximum a posteriori probability (MAP) algorithm is a "soft" output algorithm that produces likelihood, or "quality," information about the value of a channel bit.

More recently, turbo decoders are promising better results for channel coded data. Turbo decoders include multiple decoders, such as multiple MAP decoders, which arbitrate for a correct result. One implementation of a turbo decoder is described in FIG. 16, below.

Figure 2:
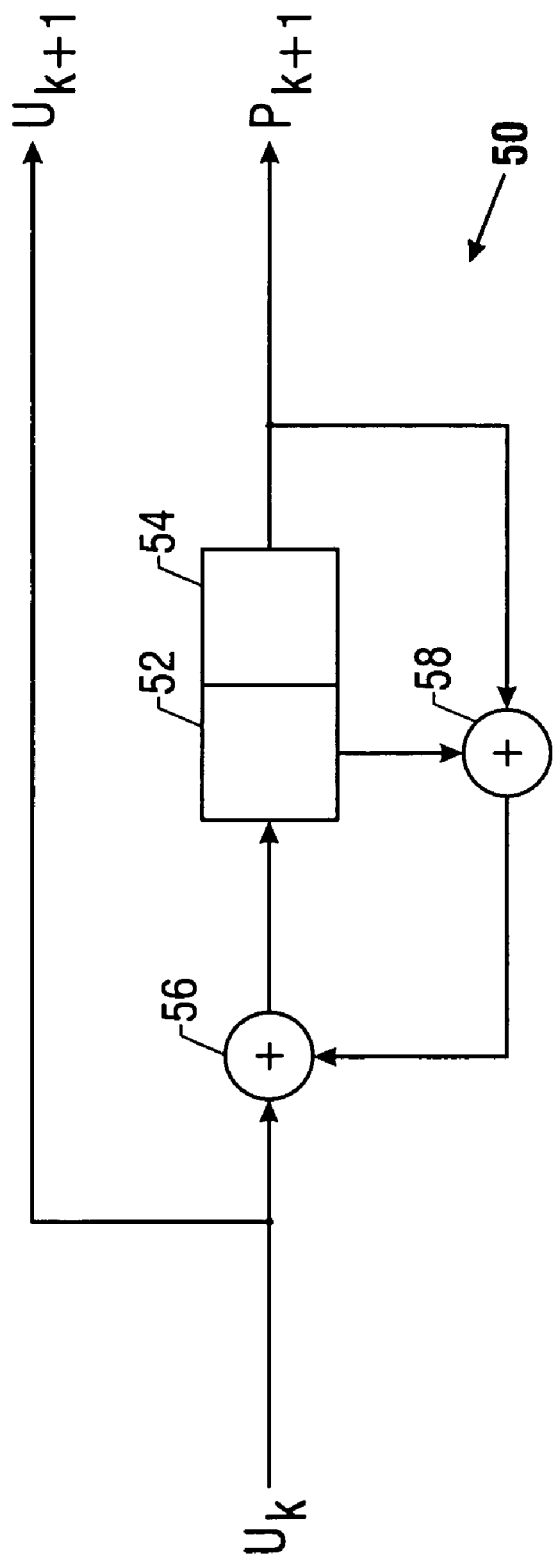
FIG. 2 is a diagram of a recursive systematic convolutional encoder, according to one embodiment of the invention.

In FIG. 2, an encoder 50 is a simple recursive systematic convolutional (RSC) encoder. A systematic code is one where parity bits, $P_{k+1}$, are attached to information bits, $U_{k+1}$, as a continuous group. The encoder 50 of FIG. 2 generates systematic codes. The encoder 50 is recursive because the output value, $P_{k+1}$, is fed back into an input value, $U_k$, for subsequent processing.

In the RSC encoder 50, information bit, $U_k$, is fed into an exclusive OR, or XOR, gate 56. The result is then fed into a shift register 52. The prior value of the shift register 52, either a "1" or a "0", is fed into a second shift register 54. Code word bits, $U_{k+1}$ and $P_{k+1}$, are generated as functions of the current state, as stored in the shift registers 52 and 54, as well as the input value, $U_k$. In the encoder 50 of FIG. 2, the code word bit, $U_{k+1}$, happens to be the same as the input value, $U_k$. The parity bit, $P_{k+1}$, however, results from both the state (shift registers 52 and 54) and the input value, $U_k$. Together, $U_{k+1}$ and $P_{k+1}$ are the code word bits for the time k+1.

With convolutional codes, each coded bit pair, ($U_{k+1}$, $P_{k+1}$), is thus dependent upon the input value, $U_k$, which is one of a plurality of information bits, as well as the values in the shift registers 52 and 54. The shift registers 52 and 54 store information about the past values of the input value, $U_k$. Successive bits, ($U_{k+n}$, $P_{k+n}$), for n=1 to the size of the information data stream, thus are not independent of past bits.

In FIG. 3, a state transition table 60 features values stored in the shift registers 52 and 54, also known as the state of the encoder 50, for each input, $U_k$ (column 0). The state transition table 60 further features bits ($U_{k+1}$, $P_{k+1}$) produced by the RSC encoder 50 of FIG. 2 that results from the input values, $U_k$ (column 2). The state transition table 60 shows the state of the encoder 50 both at time k (column 1) and at time k+1 (column 3). The state transition table 60 thus supplies a complete representation of output values, $U_{k+1}$, $P_{k+1}$, of the encoder 50, for a given input value, $U_k$, as well as supplying state information stored in shift registers 52 and 54.

Figure 4:
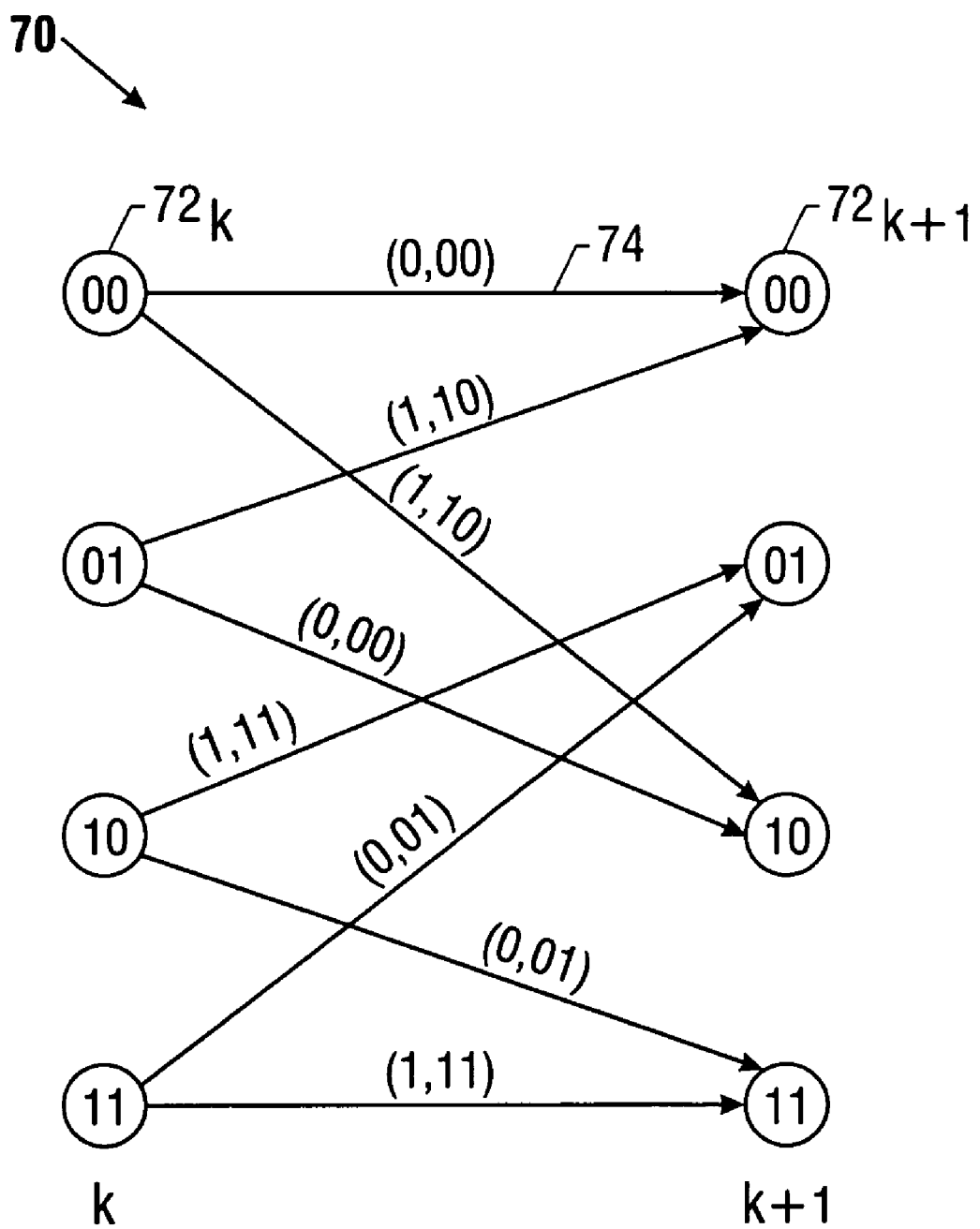
FIG. 4 is a trellis for the encoder of FIG. 2, according to one embodiment of the invention.

From the state transition table 60, a trellis 70 may be generated, as depicted in FIG. 4. A trellis is a state machine that shows the possible transitions of an encoder between two states. The trellis 70 of FIG. 4 is comprised of four nodes $72_k$, in stage k, labeled 00, 01, 10, and 11. (The notation, $72_{stage}$ is used to describe all the nodes 72 at a particular stage.)

The trellis 70 further includes four nodes $72_{k+1}$, also labeled 00, 01, 10, and 11, in stage k+1. The states 00, 01, 10, and 11 correspond to the values in the shift registers 52 and 54 of the encoder 50. The nodes $72_k$ and $72_{k+1}$ represent the state of the encoder 50 at stages k and k+1, respectively, as shown in columns 0 and 3, respectively, of the state transition table 60 of FIG. 3.

Connecting the nodes $72_k$ to the nodes $72_{k+1}$ are branches 74. The two branches 74 indicate that there are two possible values for $U_k$, 0 or 1, which may extend from any of the four possible states 00, 01, 10, and 11.

On each branch 74 of the trellis 70, the input value, $U_k$, as well as the output bits, $U_{k+1}$, $P_{k+1}$, are represented in the form ($U_k$, $U_{k+1}$ $P_{k+1}$). Each branch 74 identifies a transition of the encoder 50, for an input value, $U_k$, from the state to the left of the branch 74 (in stage k) and to the state to the right of the branch 74 (in stage k+1).

Figure 5:
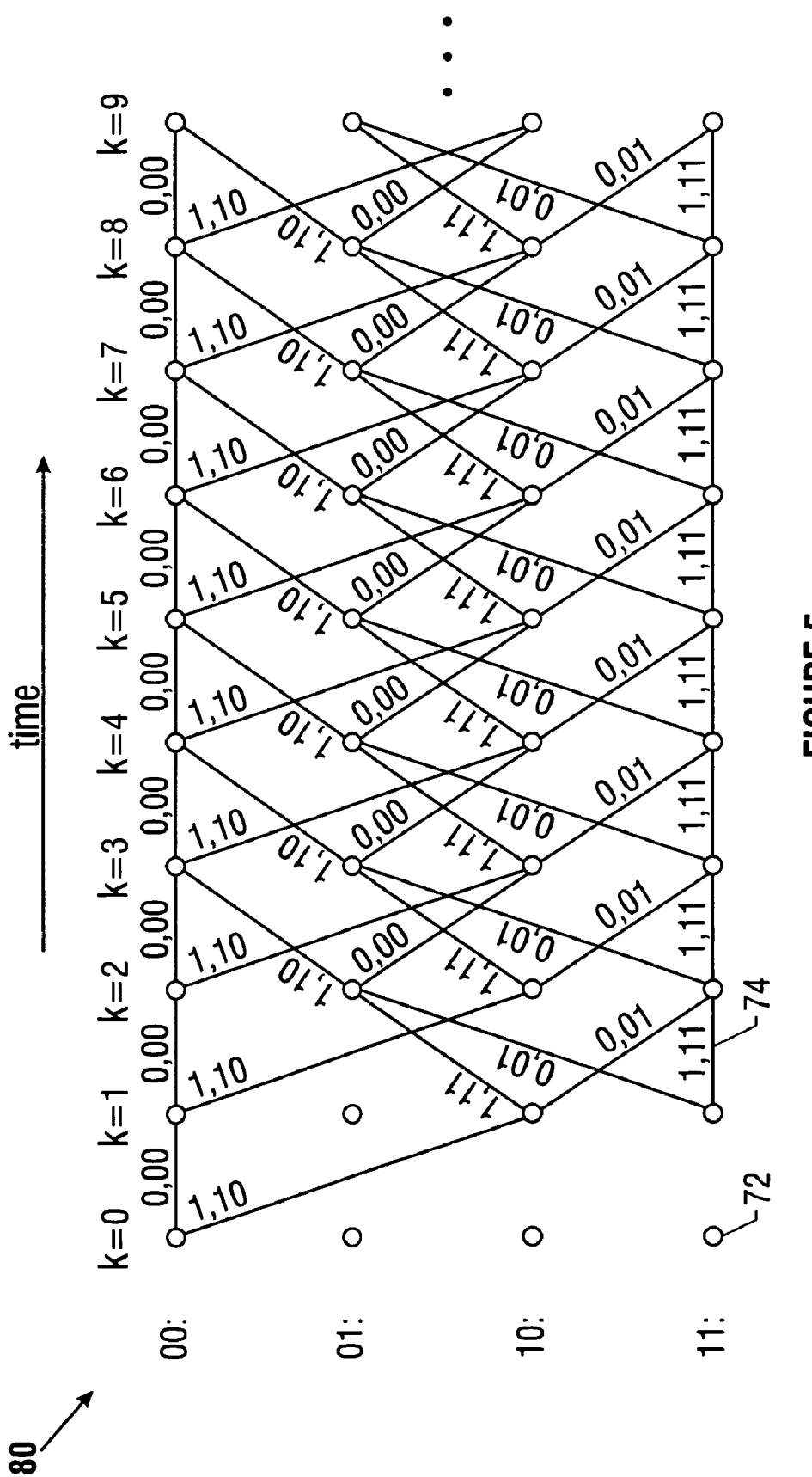
FIG. 5 is a trellis diagram for the encoder of FIG. 2, according to one embodiment of the invention.

Like a trellis, a trellis diagram is a state machine used to describe the behavior of an encoder. The trellis diagram, however, demonstrates all possible state transitions of the encoder over time. In FIG. 5, a trellis diagram 80 includes possible state transitions for the RSC encoder 50 of FIG. 2. The trellis diagram 80 is simply a serial concatenation of the trellis 70 of FIG. 4.

Four states 72 are possible in the trellis diagram 80: 00, 01, 10, and 11 (recall that the states 72 correspond to the shift registers 52 and 54 of the encoder 50). The variable, k, represents a stage of the trellis diagram 80. Each stage is a distinct point in time, where k=0 at the beginning of the trellis diagram 80, at time 0, k=1 at a subsequent point in time, and so on. The trellis diagram 80 may include hundreds or even thousands of stages, corresponding to the number of information bits, $U_k$, fed into the encoder 50. In FIG. 5, only the first ten stages of the trellis diagram 80 are depicted.

Like the trellis 70 of FIG. 4, the trellis diagram 80 includes four nodes 72 in each stage k. The states 00, 01, 10, and 11 are listed sequentially in a column to the left of the trellis diagram 80. Each of four nodes 72 in stage k represents one of the states 00, 01, 10, or 11. Further, extending from each node 72 are branches 74, one to represent each transition from the nodes $72_k$ to the nodes $72_{k+1}$.

In the $0^{th}$ state, two branches 74 extend only from the node 72 that represents state 00. In one embodiment, the encoder 50 is presumed to begin encoding with a value of 0 in the shift register 52 as well as a value 0 in the shift register 54. Accordingly, the remaining states 01, 10, and 11 in the $0^{th}$ stage are "impossible" and no branches extend from these states.

In the next stage (k=1), branches 74 extend from the nodes 72 representing states 00 and 10, since these are the possible transitions from the $0^{th}$ stage, given input values 0 and 1, respectively. From state 10, branches 74 extend to the other two possible states, 01 and 11. Thus, from k=2 on, each stage k to stage k+1 is identical and is exactly as represented in the trellis 70 of FIG. 4.

Figure 6:
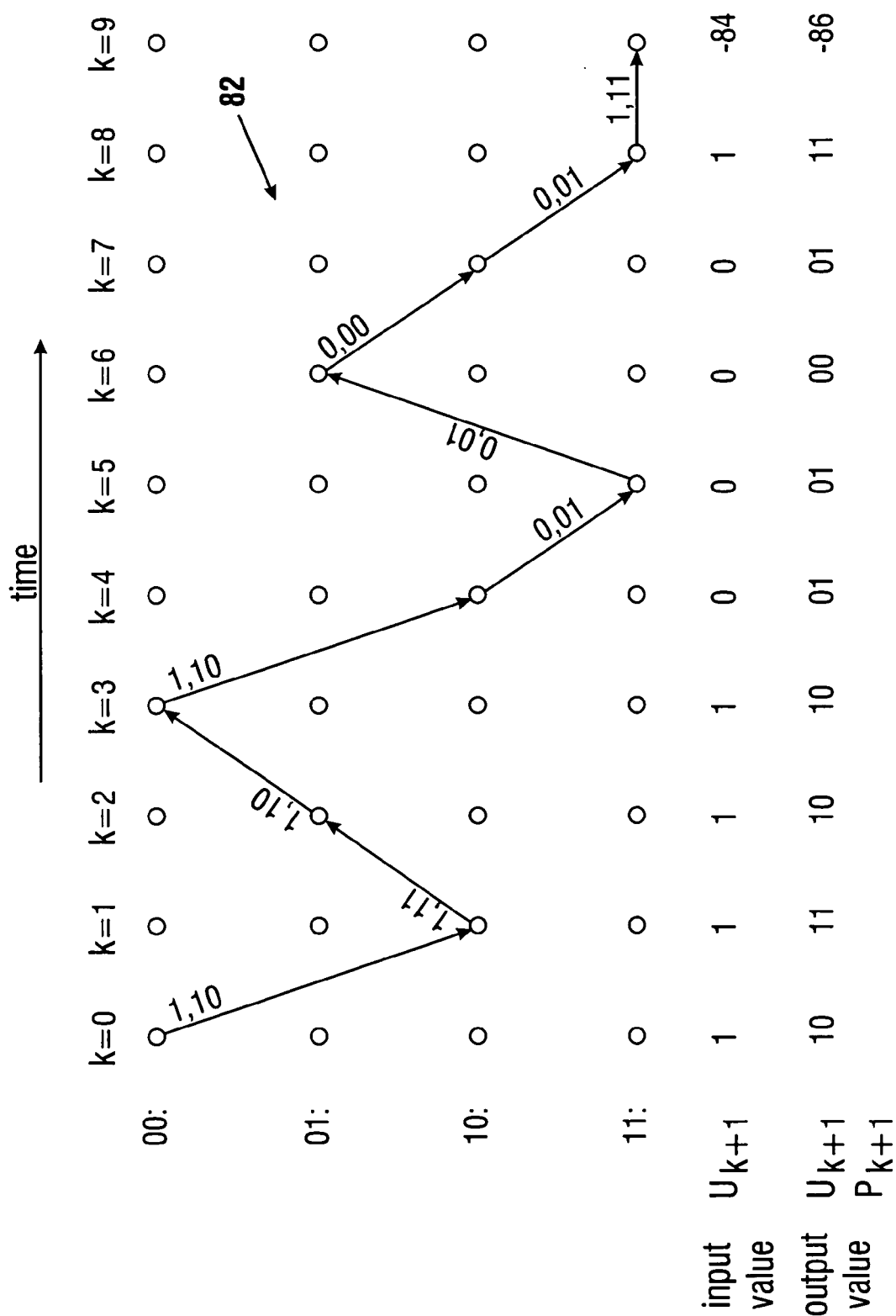
FIG. 6 is the trellis diagram of FIG. 5 illustrating a possible path using the encoder of FIG. 2, according to one embodiment of the invention.

The trellis diagram 80 provides a complete representation of the encoder 50: the input values, the states and the output values. By joining branches 74 at each stage k, a path 82, as in FIG. 6, represents encoded binary output code word 86, 101110100101000111, for binary input value 84, 111100001, where k=9. The path 82, however, represents just one of many possible paths through the trellis diagram 80.

Figure 7:
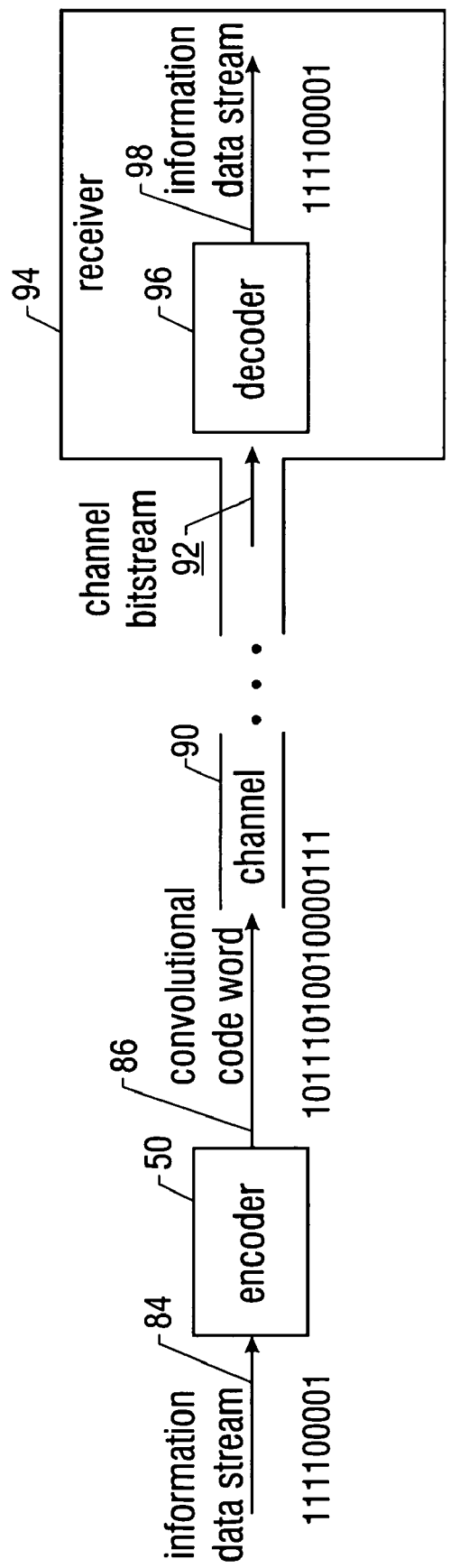
FIG. 7 is a block diagram of the path that an information data stream may take, according to one embodiment of the invention.

Suppose the encoder 50 of FIG. 2 receives the 9-bit information data stream 84, with the value of 111100001, and produces the 18-bit binary convolutional code word 86, with a value of 101110100101000111, as depicted in FIG. 6. The code word 86 is then transmitted across a channel medium 90 to a receiver 94 which includes a decoder 96, as in FIG. 7. The decoder 96 receives a channel bit stream 92 which may or may not be the same bit stream as the convolutional code word 86.

The decoder 96 produces information data stream 98 from the channel bit stream 92. If the information data stream 98 is identical to the information data stream 84, the decoder 96 has successfully decoded the channel bit stream 92.

Because of noise or other phenomena in the channel medium 90, the channel bit stream 92 may often be different from the code word 86 sent through the channel 90. The convolutional word 86, however, includes not just information bits ($U_k$), but also parity bits ($P_k$), which are based on the original information bits. Although some bits may be different, the channel bit stream 92 likewise includes both information and parity bits. The decoder 96 uses this information as well as a trellis diagram which provides a "blueprint" of the encoder, to extract the correct information data stream 96.

A fundamental concept in decoding using trellis diagrams is that the coded sequence is equivalent to a path, such as the path 82 of FIG. 6 in the trellis diagram 80. The path thus provides both the input sequence, $U_k$, to the encoder 50, and the output sequence $U_{k+1}$, $P_{k+1}$ from the encoder 50, as specified on the branches 74. Somewhere in the trellis diagram 80, the decoder 96 may uncover the correct path 82.

Accordingly, where an encoder may be described using a trellis diagram, its associated decoding algorithms are typically based upon the trellis diagram 80 to reconstruct the input sequence, $U_k$. The decoder 96 decides which path 82 of the trellis diagram 80 is the most likely path, given the channel bit stream 92.

Figure 8:
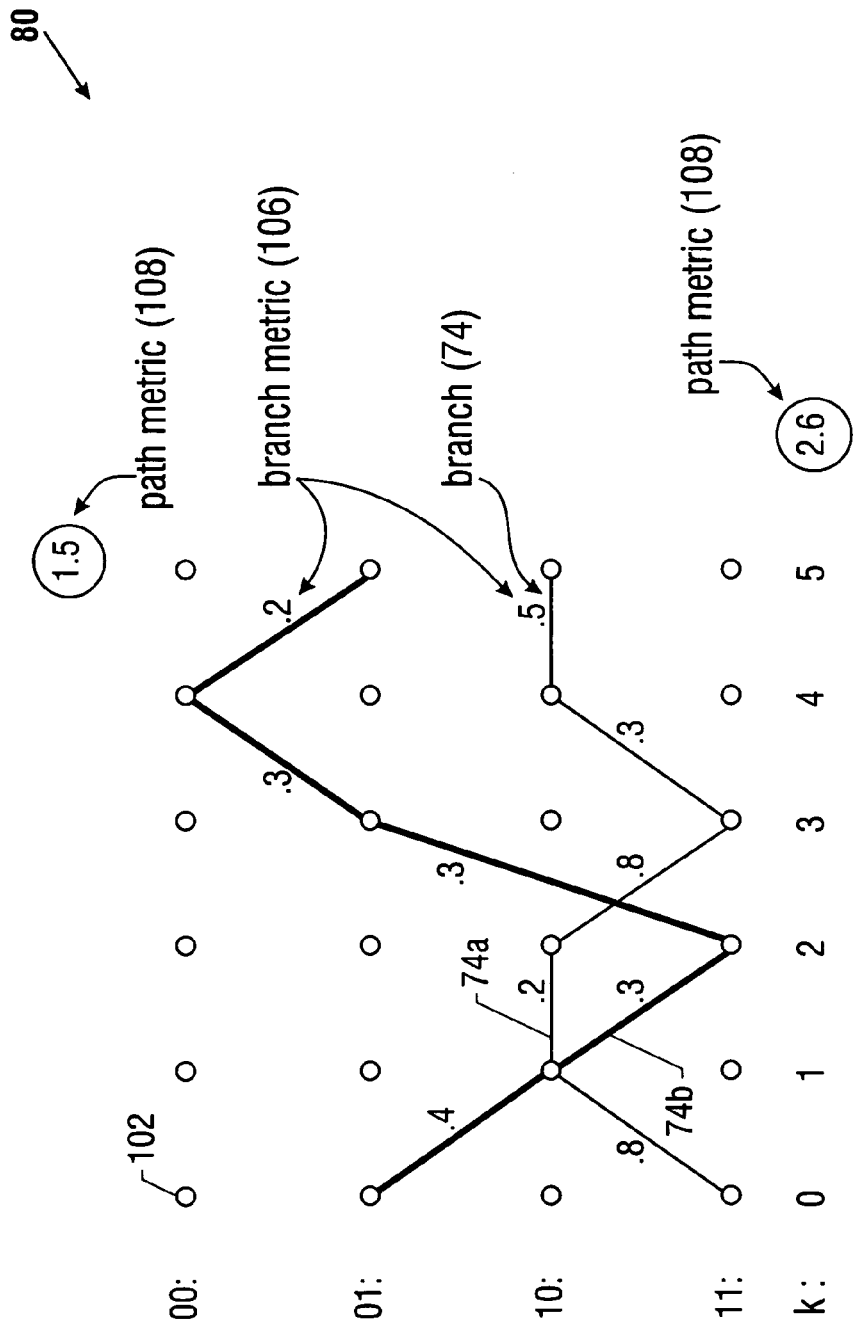
FIG. 8 is a diagram illustrating both branch and path metrics of a trellis diagram, according to one embodiment of the invention.

To understand how the decoder 96 may operate upon the trellis diagram 80, consider the diagram of FIG. 8. Six stages k, labeled 0–5, of the four-state trellis diagram 80 of FIG. 5 are shown. For hard-output decoding algorithms, the decoder 96 may, at each stage k, determine whether the encoded bit was a "1" bit or a "0" bit. In contrast, where the decoder 96 uses soft-input/soft-output (SISO) algorithms, the quality of a given path 82 of the trellis diagram 80 is assessed. The decoder 96 thus supplies probability data rather than a "1" or a "0" bit. Accordingly, for soft-output algorithms, the path 82 is defined using a number known as a metric. The metric represents the probability that a path will be taken in the trellis diagram 80, given the channel bit stream 92 received by the decoder 96.

For the RSC encoder 50 of FIG. 2, the two possible input values of $U_k$, 0 or 1, correspond to two possible branches 74 extending from each node 72. Thus, in FIG. 8, at stage 1, two branches 74 extend from the node 72 for the '10' state. Likewise, each branch 74 is associated with a likelihood, or branch metric 106. In FIG. 8, the branch metric 106 is a number labeling the branch 104. The top branch 74a has a branch metric 106 of 0.2. The bottom branch 74b has a branch metric 106 of 0.3.

The branch metric 106 is "soft" information, typically a log probability, indicating the likelihood of reaching the next node 72, given the channel bit stream 92 received by the decoder 96. The decoder 96 calculates the branch metric 106.

With the Viterbi algorithm, the objective of the decoder 96 is to get the best path 82 from the trellis diagram 80. For soft output algorithms, such as the MAP algorithm, the decoder 96 instead determines, in each stage k of the trellis, the likelihood that the information bit, $U_k$, is a 0 or a 1. The decoder 96 thus iteratively traverses the trellis diagram 80, one stage at a time, computing likelihood information based upon the received bit stream and the trellis diagram 80.

Essentially, the decoder 96 considers all the possible paths 82 of the trellis diagram 80. For each path 82 considered, the decoder 96 adds up the branch metrics 106 for the path 82, resulting in a path metric 108. The decoder 96 then selects the path 82 with the largest path metric 108. The path 82 with the largest path metric 108 is the maximum likelihood path. The selected path 82 is also known as the survivor path. From the path 82, the information bits, $U_k$, may then be determined.

The decoder 96 thus "travels" through the trellis diagram 80, computing branch metrics 106 and path metrics 108 along the way. For some algorithms, the trellis diagram 80 is traversed a single time. For other algorithms, however, the trellis diagram 80 may be traversed in both a forward and a backward direction. Nevertheless, both the Viterbi and MAP algorithms, as well as others which operate on the trellis diagram 80, may perform a staggering number of computations before arriving at the desired result.

The number of possible paths 82 of the trellis diagram 80, for example, is $2^{trellis\ length}$. So, if the encoder 50 encodes 100 information bits, the decoder 96 has $2^{100}$ possible paths 82 to consider (about $10^{30}$ paths). The computation may be even more complex if each of the branch metrics 106 is not stored in a memory.

Figure 9:
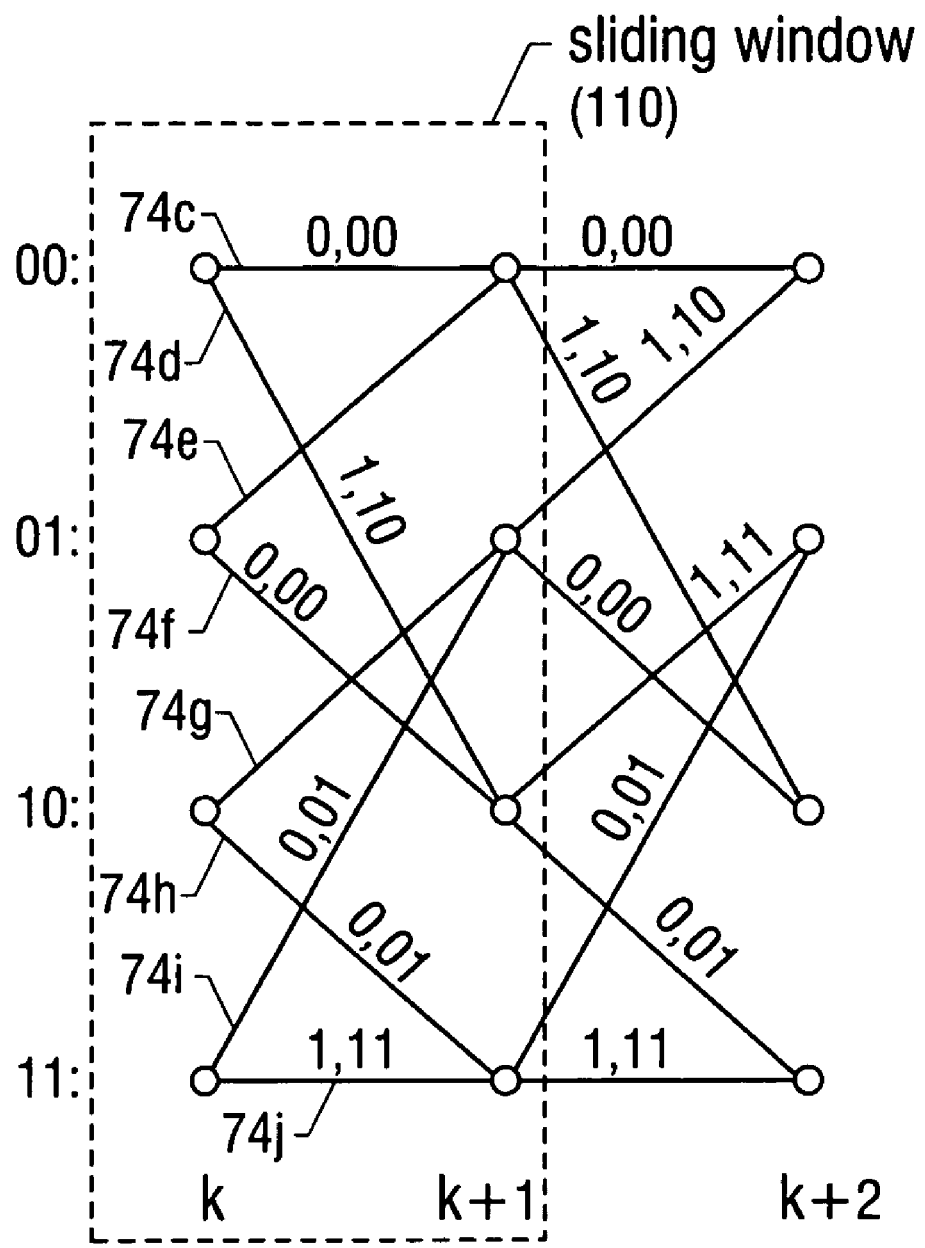
FIG. 9 is a trellis diagram used to illustrate butterfly operations, according to one embodiment of the invention.

In FIG. 9, a portion of the trellis diagram 80 of FIG. 5 includes stages k, k+1, and k+2. A sliding window 110 encases stage k and k+1. The decoder 96 may use the sliding window 110 to arbitrarily compute the branch metrics 106 along the trellis 80.

For example, in stage k, from the node $72_k$ corresponding to the state 00, a branch 74c and a branch 74d extend to nodes $72_{k+1}$ (at stage k+1). Likewise, from the node $72_k$ corresponding to the state 01, two branches 74e and 74f extend. From node $72_k$ (state 10), branches 74g and 74h, and from node $72_k$ (state 11), branches 74i and 74j, extend to the node $72_{k+1}$ (stage k+1). The branches 74c, 74e, 74g and 74i correspond to a "0" input value to the encoder 50 while the branches 74d, 74f, 74h and 74j correspond to the "1" input value.

While the sliding window 110 is in the position in FIG. 9, the decoder 96 computes branch metrics 106 for each of the branches 74c through 74j, for a total of eight computations. Except when k=0, one or more paths 82 extend to the nodes $72_k$ from prior stages. One of the paths 82 is the survivor path. Accordingly, a new path metric 108 may be calculated by taking the path metric 108 of the survivor path. A first branch metric 106 may be added to the path metric 108, then a second branch metric 106 may be added to the path metric 108. The two results may be compared. The path 82 with the larger path metric 108 is the new survivor path for stage k. This group of calculations is known as a butterfly operation.

Once the butterfly operation is complete for stage k, the sliding window 110 may be moved, forward or backward, according to the algorithm, so that the next group of butterfly operations may be performed.

For the sliding window 110 of FIG. 9, up to four butterfly operations may be performed, one for each node $72_k$. The branch metric 106 of each branch 74 is added to the path metric 108, (addition operation). Each resulting path metric 108 is then compared to the other path metric 108 to determine which result is the larger (compare operation). The resulting path metric 108, or survivor path, is selected (select operation). The butterfly operation is thus sometimes known as the add-compare-select, or ACS, operation. Finally, the survivor path is stored, such as in a memory.

Figure 10:
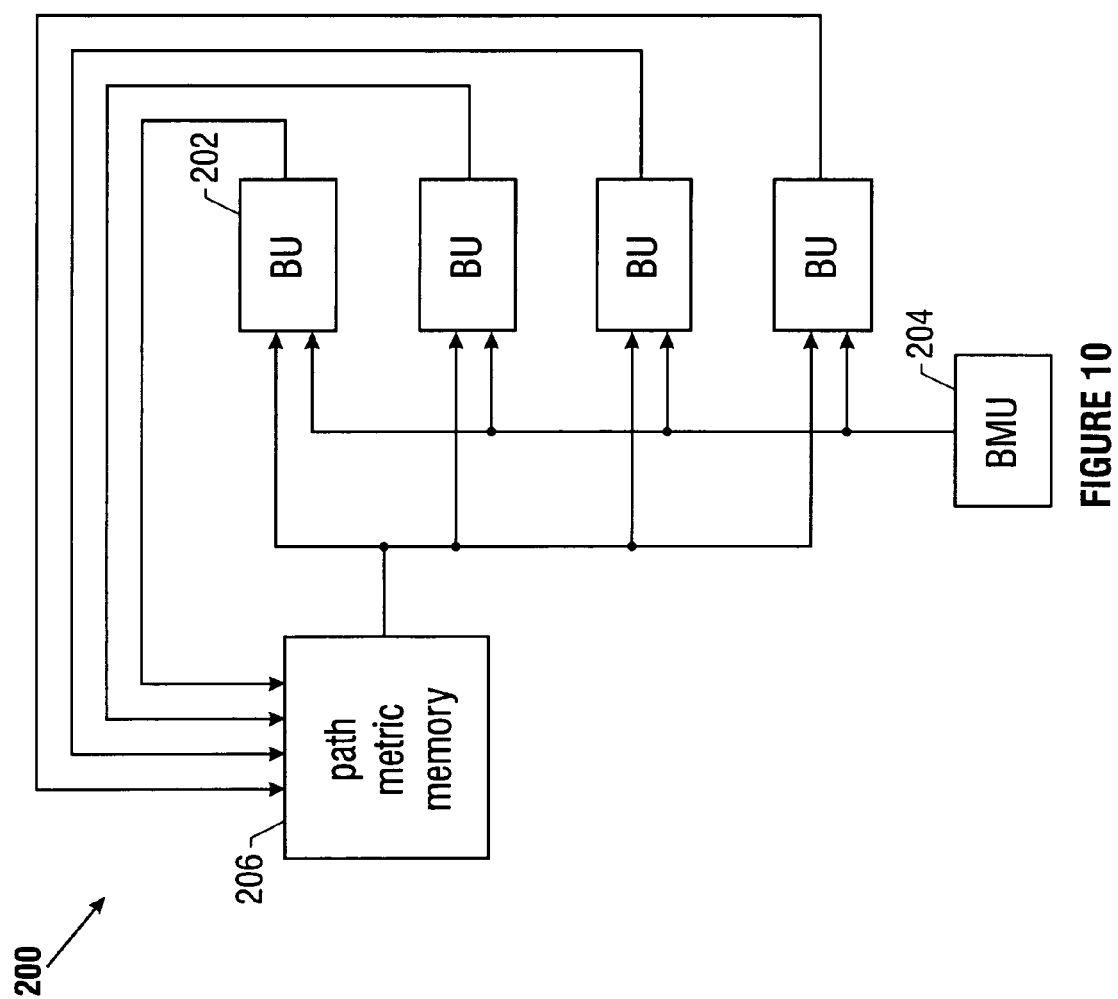
FIG. 10 is a block diagram of a butterfly operator, according to one embodiment of the invention.

In FIG. 10, according to one embodiment, a system 200 may be used for performing butterfly operations such as those described above. The system 200 includes one or more butterfly units 202, a branch metric unit 204, and a path metric memory 206. Together, the circuitry of the system 200 may perform the ACS, or log-MAP, butterfly operation.

In one embodiment, the branch metric unit 204 performs the calculations for the branch metrics 106, described in FIG. 8, above. The branch metrics 106 are calculated by analyzing the channel data 92 as well the four possible output values, $U_{k+1}$, $P_{k+1}$, that would be produced by the encoder 50 and computes a likely metric 106. Branch metrics 106 are calculated for each node $72_k$. Notice that the branch metric unit 204 is not connected to the path metric memory 206, since the path metric 108 from a prior stage is not considered in computing branch metrics 106.

In the embodiment of FIG. 10, each butterfly unit 202 receives a branch metric 106 from the branch metric unit 204. Since there are four nodes 72 in each stage k, four butterfly units 202 are provided. Thus, according to one embodiment, each butterfly unit 202 may perform calculations in parallel with each other butterfly unit 202, so that new path metrics for each state, 00, 01, 10, and 11, may be calculated simultaneously.

Further, each butterfly unit 202 receives a path metric 108 from the path metric memory 206. With this information, the butterfly units 202 may each perform add-select-compare operations for a given node 72$_k$ of the trellis diagram 80.

The output path of each butterfly unit 202 is also coupled to the path metric memory 206. Each butterfly unit 202 may thus send the resulting path metric to the path metric memory 206 for storage, until a new set of butterfly operations, at stage k+1, is performed.

Figure 11:
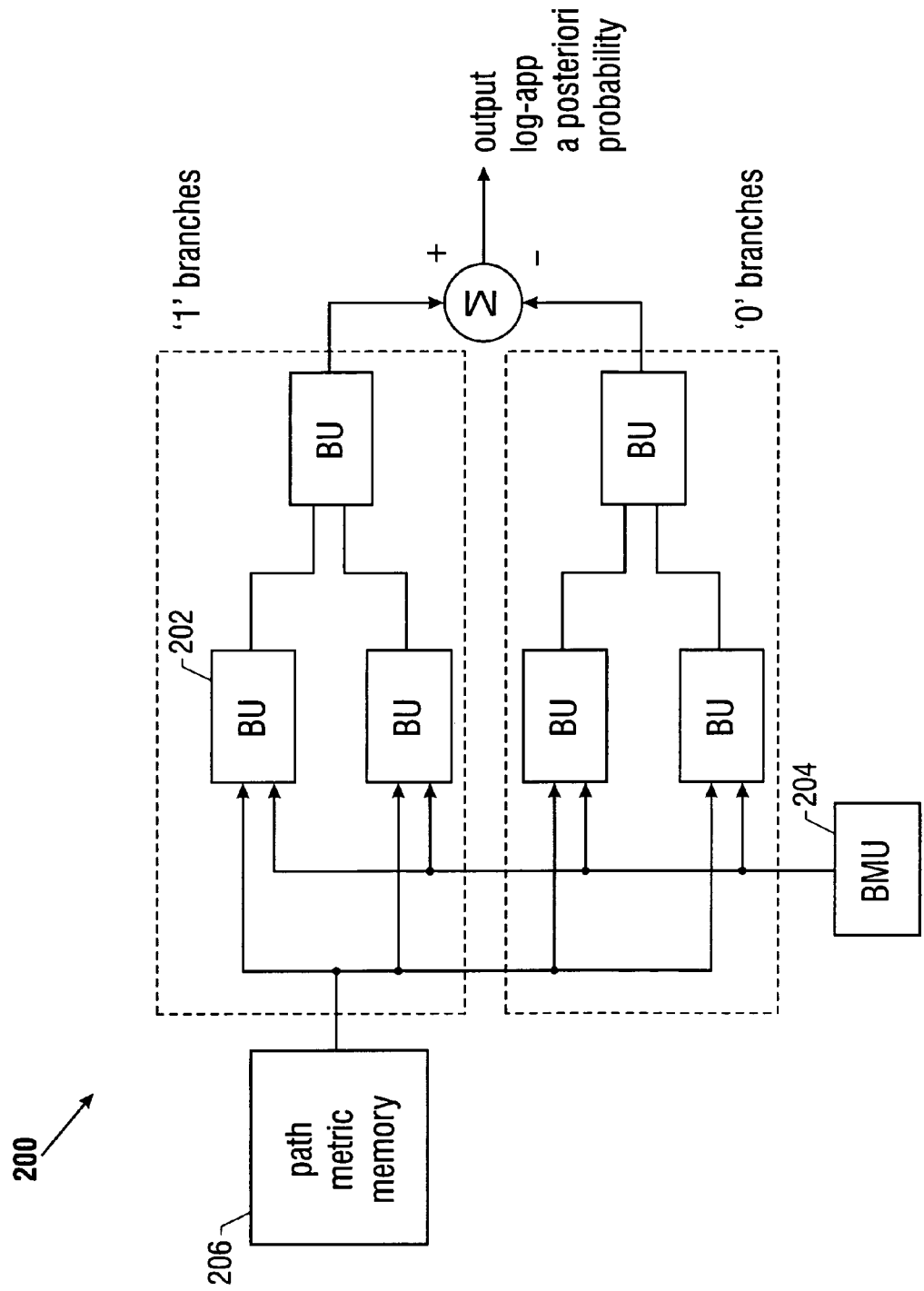
FIG. 11 is a second block diagram of a butterfly operator, according to a second embodiment of the invention.

In FIG. 11, a second embodiment of the system 200, implements the MAP algorithm described herein. The decoder 96 may use the system 200 to perform trellis operations in both a forward and backward direction on the trellis diagram 80. The MAP algorithm is a two-path algorithm where trellis operations are performed in both a forward and a backward direction relative to the trellis diagram. In both the forward and the backward passes, trellis node metrics are calculated.

During the forward pass, the node metrics may be stored in the path metric memory 206. Then, during the backward pass, the sliding window metrics are calculated, then combined with the forward path metrics stored in the node metric memory 206. Alternatively, the backward pass may precede the forward pass, as desired.

The trellis has N states at each stage. The system 200 of FIG. 11 reduces the metrics for all N states, both in the forward and in the backward direction, to a single bit reliability metric. This is the final soft output of the MAP algorithm.

Using the arrangement of the butterfly units 202 as shown in FIG. 11, both a forward path metric and a backward path metric may thus be calculated. The top three butterfly units 202 are used for the "1" branches 104, while the bottom three butterfly units 202 are used for the "0" branches 104.

In FIG. 11, according to one embodiment, the branch metric unit (BMU) 204 calculates the current branch metrics 74 for the stage k. The butterfly units 202 then retrieve a forward (or a backward) path metric 108 from the path metric memory 206 as well as the branch metrics 74 from the branch metric unit 204. Then, two at a time, each butterfly unit 202 combines the results and subtracts the difference to produce an a posteriori probability value.

Figure 12:
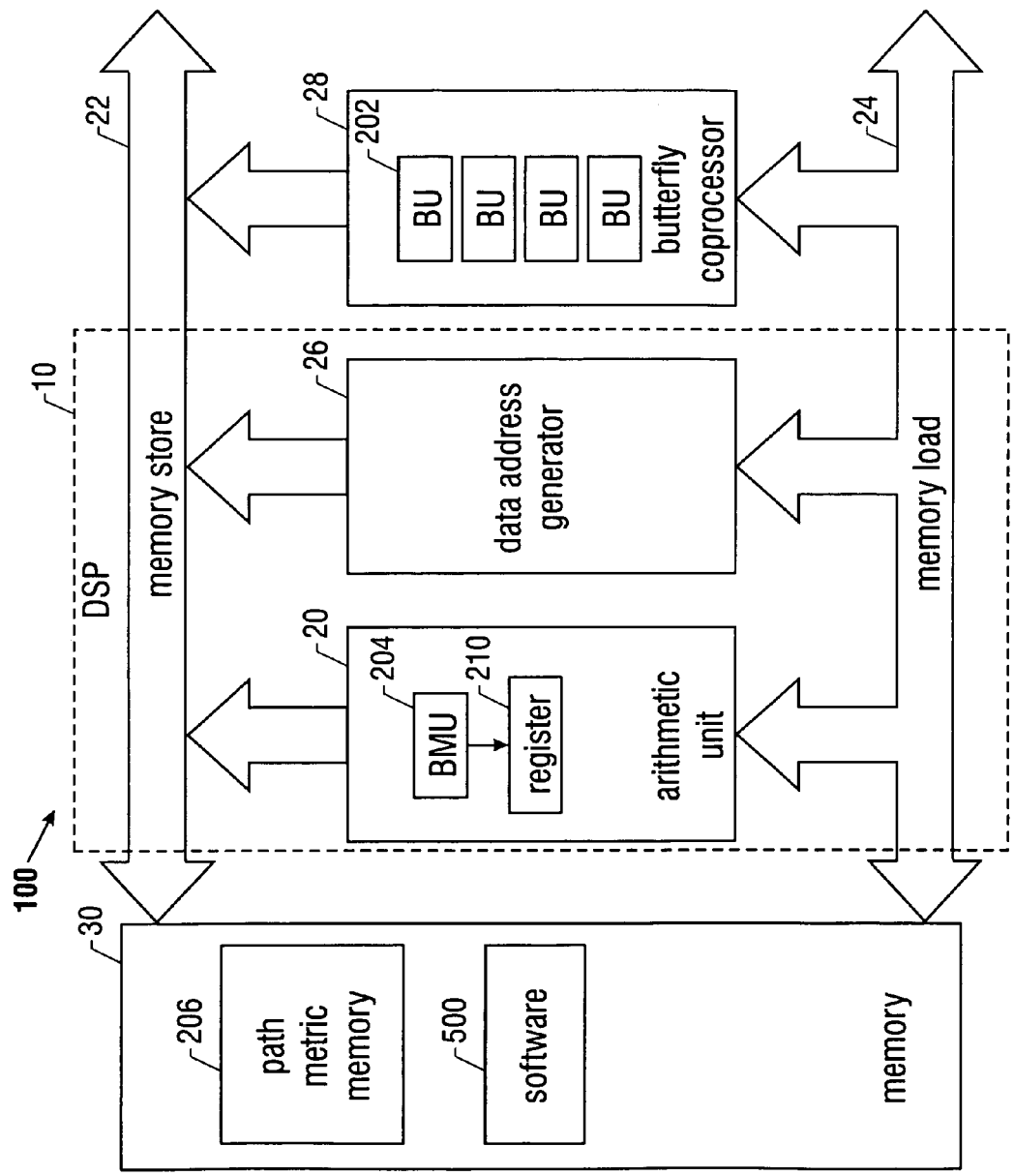
FIG. 12 is a block diagram of the butterfly operator of FIG. 10, used in the system of FIG. 1, according to one embodiment of the invention.

In FIG. 12, the system 200 of FIG. 10 is implemented in the system 100 (FIG. 1), according to one embodiment. As expected, the path metric memory 206 is part of the larger available memory 30. The path metric memory 206 is accessible to the rest of the circuitry by the memory store bus 22 and the memory load bus 24.

In FIG. 12, the branch metric unit 204 is part of the arithmetic unit 20. The branch metric unit 204 need not access the path metric memory 206 in performing its calculations. Instead, the branch metric unit 204 supplies information to the butterfly units 202.

Accordingly, in one embodiment, the arithmetic unit 20 includes registers 210 addressable by the data address generator 26. Upon completing an operation, the BMU 204 stores a result in the registers 210. The butterfly units 202 may then obtain the results of the BMU 204 operations by accessing the registers 210 using the data address generator 26, just as the memory 30 is accessed.

In one embodiment, the butterfly coprocessor 28 includes the four butterfly units 202. To perform the butterfly calculations, the butterfly units 202 access the path metric memory 206 and the registers 210 using the data address generator 26 and the memory load bus 24. The butterfly units 202 then perform the add-compare-select operations to calculate the path metric 108 for the nodes 72 at the current stage in the sliding window 110. Once the butterfly operations are complete, the butterfly units 202 store the results in the path metric memory 206 by placing the results on the memory store bus 22.

In the embodiment of FIG. 12, the DSP 10 performs memory management on behalf of the butterfly coprocessor 28. Further, however, the DSP, by including the branch metric unit 204 operations in its arithmetic units 20, is also performing part of the butterfly operations. This permits the butterfly coprocessor 28 to dedicate all attention to the parallel performance of the various node operations by the butterfly units 202.

Other embodiments are possible for implementing the system 200 of FIG. 10. For example, in FIG. 12, once the branch metric unit 204 has computed the branch metrics 106, the branch metric unit 204 stores results in registers 210 located in the arithmetic units 20. The data address generator 26 then accesses the registers 210, at the request of the butterfly coprocessor 28.

Alternatively, the branch metric 204 could be located in the butterfly coprocessor 28 itself. The alternative configuration obviates the need for the registers 210 because the branch metric unit 204 may be connected directly to the butterfly units 202. The butterfly coprocessor 28 performs both branch metric unit 106 operations and the add-compare-select operations.

Further, in some embodiments, the system 100 may be programmable. For example, registers may define the connectivity between the branch metric unit 204 and the DSP 10. Whether implemented simply for memory management or to perform part of the butterfly operations, the DSP 10 may be involved in the trellis decoding on a stage-by-stage basis. In one embodiment, the DSP 10 provides a memory interface for the butterfly coprocessor 28. In some embodiments, the DSP 10 additionally performs algorithmic scheduling on behalf of the butterfly coprocessor 28.

The butterfly coprocessor 28 thus implements parallel butterfly operations using multiple butterfly units. In one embodiment, the system 100 increases the throughput of performing the very complex operations involved in decoding a channel bit stream.

In one embodiment, the system 100 includes a software program 500, shown stored in the memory 30. Using the software program 500, the system 100 may flexibly be implemented for a number of decoding schemes. Further, whenever a new decoding technique is developed, a new software program may be loaded into the system 100.

Figure 13:
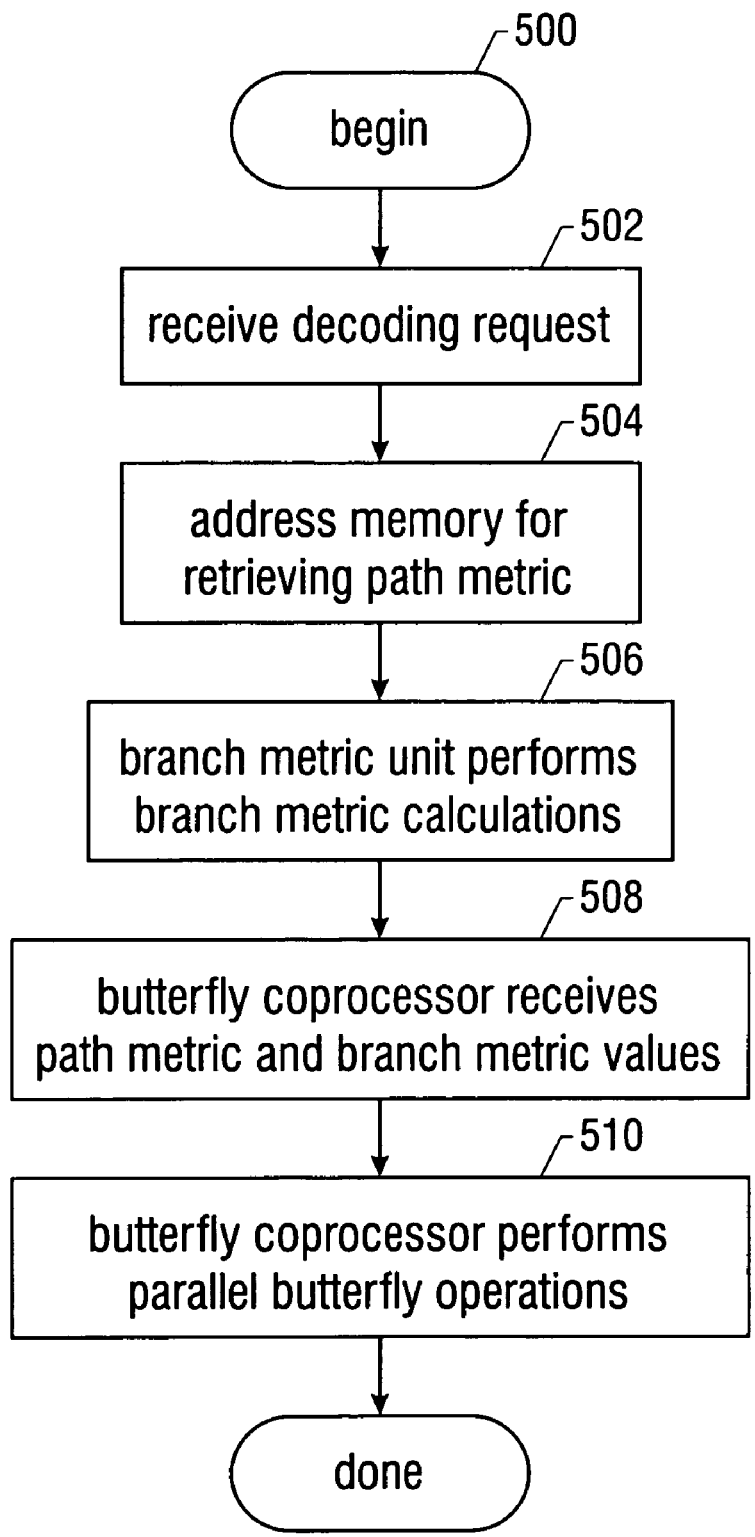
FIG. 13 is a flow diagram of a software program used by the system of FIG. 12, according to one embodiment of the invention.

In FIG. 13, the software program 500 manages the decoding operation, according to one embodiment, by receiving a decoding request (block 502). In the embodiment of FIG. 12, the path metrics 108 are stored in the path metric memory 206. Accordingly, the software program 500 may address the memory 30, using the data address generator 26, to retrieve the path metrics 108 from the path metric unit 206 (block 504). The path metrics 108 may then be sent to the butterfly coprocessor 28.

Looking back to FIG. 10, in addition to receiving the path metrics 108, the butterfly units 202 also receive the branch metrics 106 as input values. Accordingly, in FIG. 13, the software program 500 directs the branch metric unit 204 to perform its branch metric calculations (block 506). The result may be stored in the registers 210, stored in the memory 30, or placed directly on the memory store bus 22, to be sent to the butterfly coprocessor 28.

The software program 500 thus directs the system 100 to send the path metric 108 and the branch metric 106 to the butterfly coprocessor 28 (block 508). The butterfly coprocessor 28 may then perform parallel butterfly operations (block 510). Thus, the trellis calculations for a single stage are performed by the system 100. The operation of the software 500, according to one embodiment, is complete.

The butterfly unit 202 may be implemented in a number of ways. In FIGS. 10 and 11, the butterfly units 202 each receive two input values, one from the path metric memory 206 and the other from the branch metric unit 204. The butterfly units 202 then produce a single output value that is sent to the path metric memory 206.

Figure 14A:
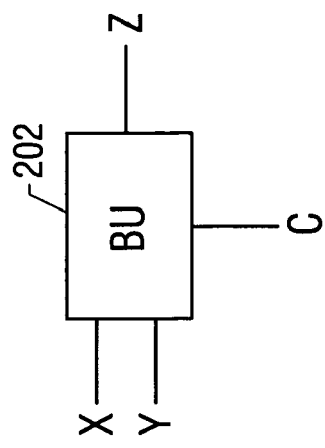
FIGS. 14a and 14b are diagrams illustrating possible operations of the butterfly unit, according to one embodiment of the invention.

In FIG. 14a, according to one embodiment, the butterfly unit 202 is implemented using algorithmic sum exponential operations. In addition to receiving a value from the path metric memory 206 and the branch metric unit 204, the butterfly unit 202 additionally receives a parameter, c. The parameter, c, may be hard-wired into the butterfly unit 202 or may be programmable, as desired. The following formulas may be implemented in the butterfly unit 202 as discrete logic:

$$z = c \log(e^{x/c} + e^{y/c}) = \max(x,y) + c \log(1 + e^{\mathit{diff}/c})$$

Figure 14B:
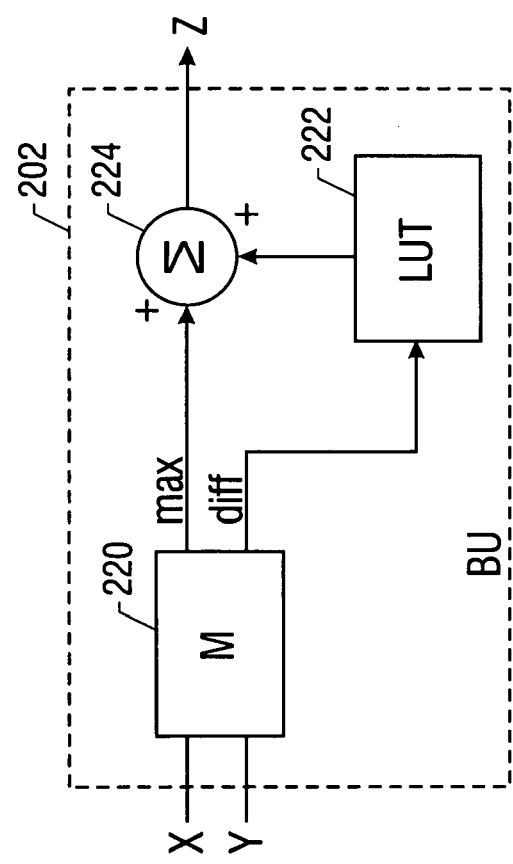

In FIG. 14b, the butterfly unit 202 performs a max operation. The butterfly unit 202 includes a max unit 220, which computes both the maximum and the difference of the input values, x and y. The maximum output value is sent to an adder 224. The difference value is sent to a lookup table 222, the result of which is then fed into the adder 224. Other algorithms for performing add-compare-select operations are well known and may be implemented in the butterfly unit 202.

Substantial benefits may be realized using the system 100, particularly with complex encoding schemes. For example, turbo codes are a recent development in FEC channel coding. Turbo codes are under consideration for use in both the wide-band and third generation code (3G) division multiple access (CDMA) standards, used in cellular phones.

Figure 15:
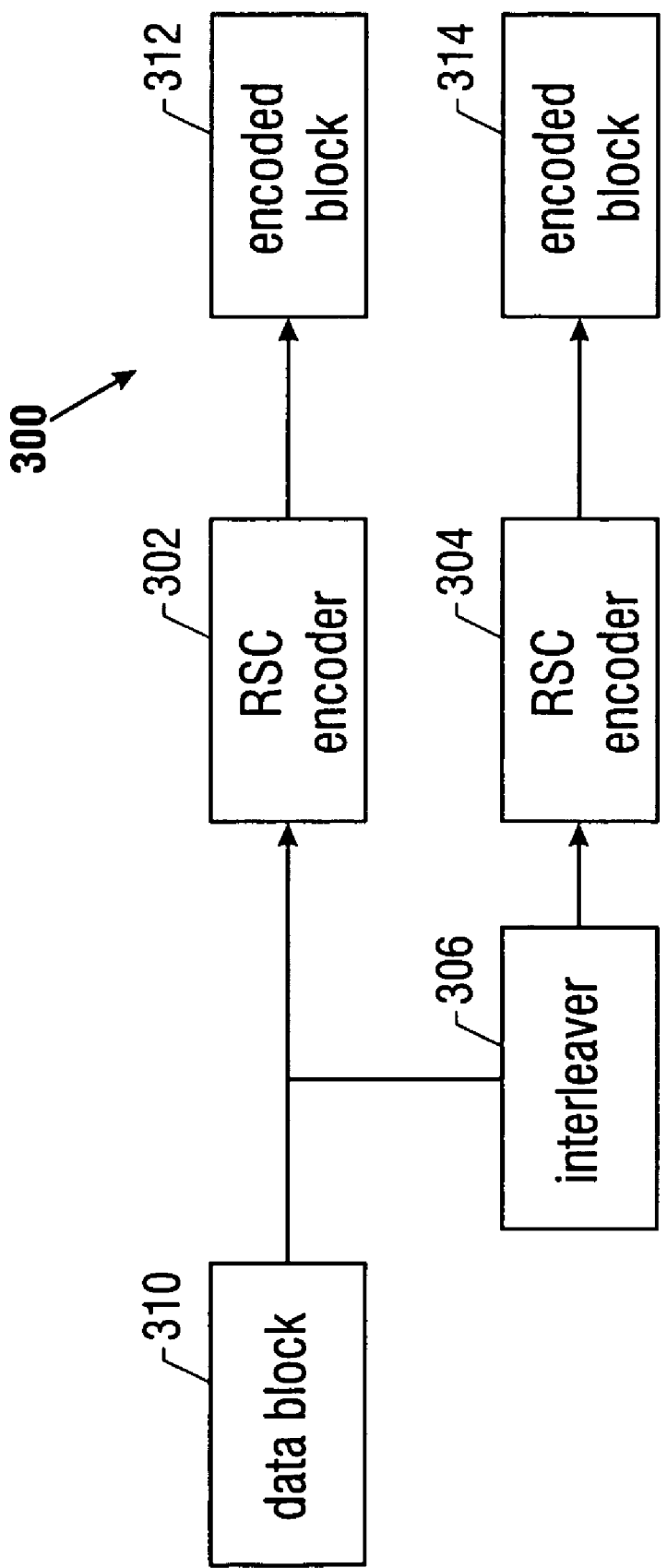
FIG. 15 is a block diagram of a turbo encoder, according to one embodiment of the invention.

In FIG. 15, a turbo encoder 300 is one well known embodiment to be used in 3G CDMA cellular technology. The encoder 300 operates on a block of data that may range in size from 320 to 5,120 bits. A block is encoded in parallel by two constituent convolutional codes, or RSC encoders 302 and 304. Prior to encoding by the RSC encoder 304, the input data block 310 is bit interleaved using an interleaver 306.

By interleaving the data block 310 before sending it to the RSC encoder 304, the turbo encoder 300 is substantially more powerful than if encoded a single time. After passing through the RSC encoders 302 and 304, the encoded block 312 and encoded block 314, respectively, may separately be sent across the channel 90 (FIG. 5), or may be combined, as desired.

In comparison to conventional convolutional encoding, the constituent codes used in turbo encoders are much less complex. Third generation systems, for example, use a k9 convolutional code for control channels, speech, and data links, with rates less than 32 kbps. The k9 code has 256 states. In contrast, the turbo constituent codes, for example, may have only 8 states.

In FIG. 16, a turbo decoder 400 includes two soft-input/soft-output (SISO) decoders 406 and 408. Each decoder 406 and 408 receives a channel bit stream 402 and 404, respectively. The channel bit stream 402 corresponds to the encoded block 312 of FIG. 15. The channel bit stream 404 corresponds to the encoded block 314 of FIG. 15.

Like the turbo encoder 300, the turbo decoder of FIG. 16 is well known. The SISO decoder 406 receives the channel bit stream 402. After decoding, the output values are passed through an interleaver 410 and are then received by the second SISO decoder 408. The second SISO decoder 408 further receives the second channel bit stream 404. After decoding, the SISO decoder 408 sends the output values to a de-interleaver 412, then pass on the de-interleaved data to the SISO decoder 406.

The process may be iterated several times before the final output is sent to a hard decision block 414, which quantifies the data as a hard output value. The turbo decoder 400 works, in part, because the SISO decoders 406 and 408 are soft-input and soft-output. Accordingly, soft information can be passed between them as often as desired. Essentially, an arbitration scheme is employed in coming to a final output value.

In one embodiment, the SISO decoder 406 is implemented using the MAP algorithm (maximum a posteriori probability). As described above, MAP is a soft-input/soft-output algorithm. Rather than producing "hard" bit decision outputs, MAP outputs are a posteriori probabilities (APPs) that indicate the likelihood of each data bit value. In comparison, the Viterbi algorithm is a soft-input/hard-output decoder.

The MAP algorithm complexity is roughly four times the Viterbi algorithm in complexity per state. Further, the MAP algorithm is much more memory intensive than the Viterbi algorithm. However, in implementing turbo codes, only 8 states are considered, as compared to 256 states for the k9 convolutional code.

In FIG. 16, the turbo decoder 400 iterates on the MAP algorithm, embodied in both SISO decoders 406 and 408. Each decoder 406 and 408 may employ the system 100 (FIG. 12) to implement the MAP algorithm. Because the turbo decoder 400 includes two decoders, each using the MAP algorithm, the parallel operations of the system 100 may result in substantially faster performance than prior art implementations.

Thus, according to several embodiments, the system 100 may be used in decoders to perform operations associated with trellis diagrams. The MAP algorithm, the Viterbi algorithm, and others perform such operations. Further, the system 100 may be implemented for either soft-or hard-output algorithms. The DSP and the butterfly coprocessor work together in performing these operations.

The division of labor between the DSP and the butterfly coprocessor may be achieved in a number of ways. In one embodiment, the DSP performs memory management and algorithmic scheduling on behalf of the butterfly coprocessor. The butterfly coprocessor implements parallel butterfly operations for increased throughput during decoding. Further, the system 100 maintains flexibility, for use in a number of possible decoding environments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
   a digital signal processor comprising a bus connectable to a memory, wherein the digital signal processor further comprises a software program which, upon execution, causes the system to:
   identify a stage of a trellis diagram;
   identify a number of nodes in the stage;
   identify a number of branches extending from each node; and a butterfly coprocessor coupled to the digital signal processor to perform an operation scheduled by the digital signal processor, wherein the butterfly coprocessor further includes a plurality of butterfly units to perform butterfly operations.

2. The system of claim 1, wherein the digital signal processor further comprises:
   a data address generator coupled to the bus to address the memory on behalf of a requesting device.

3. The system of claim 2, wherein the digital signal processor further comprises an arithmetic unit to perform arithmetic operations in the digital signal processor.

4. The system of claim 3, wherein the arithmetic unit further comprises a branch metric unit to perform branch metric calculations.

5. The system of claim 4, wherein the arithmetic unit further comprises one or more registers to which the branch metric unit may store one or more results.

6. The system of claim 5, further comprising one or more registers in the arithmetic unit addressable by the data address generator.

7. The system of claim 1, wherein the butterfly operations are parallel operations.

8. The system of claim 7, wherein the plurality of butterfly units in the butterfly coprocessor are coupled to further perform add-compare-select operations at the direction of the digital signal processor.

9. The system of claim 7, wherein the plurality of butterfly units in the butterfly coprocessor are coupled to further perform approximations of logarithmic sum exponential operations at the direction of the digital signal processor.

10. The system of claim 7, wherein the data address generator is coupled to access a path metric retrieved from a path metric memory.

11. The system of claim 10, wherein the data address generator of the digital signal processor is coupled to retrieve a branch metric from a branch metric unit.

12. A system comprising:
    a digital signal processor including:
       a bus connectable to a memory;
       a data address generator; and
       an arithmetic unit, wherein the digital signal processor further comprises a software program which, upon execution, causes the system to:
    identify a stage of a trellis diagram;
    identify a number of nodes in the stage; and
    identify a number of branches extending from each node; and
    a butterfly coprocessor coupled to the digital signal processor to perform an operation scheduled by the digital signal processor.

13. The system of claim 12, wherein the butterfly coprocessor further comprises a plurality of butterfly units.

14. The system of claim 13, wherein the number of butterfly units equals the number of nodes in the stage.

15. The system of claim 14, wherein the butterfly coprocessor is coupled to compute path metrics for the stage.

16. The system of claim 15, wherein the butterfly units are coupled to simultaneously compute a path metric for each node of the stage.

* * * * *